United States Patent
Hiller et al.

(10) Patent No.: US 7,255,976 B2
(45) Date of Patent: Aug. 14, 2007

(54) LASER-ENGRAVABLE FLEXO PRINTING ELEMENTS FOR THE PRODUCTION OF FLEXO PRINTING FORMS CONTAINING BLENDS OF HYDROPHILIC POLYMERS AND HYDROPHOBIC ELASTOMERS

(75) Inventors: Margit Hiller, Karlstadt (DE); Jens Schadebrodt, Mainz (DE); Jürgen Kaczun, Niederkirchen (DE); Thomas Telser, Heidelberg (DE); Wolfgang Wenzl, Mannheim (DE)

(73) Assignee: XSYS Print Solutions Deutschland GmbH, Stuttgart (DE)

( * ) Notice: Subject to any disclaimer, the term of this patent is extended or adjusted under 35 U.S.C. 154(b) by 76 days.

(21) Appl. No.: 10/495,924

(22) PCT Filed: Nov. 15, 2002

(86) PCT No.: PCT/EP02/12810

§ 371 (c)(1),
(2), (4) Date: May 18, 2004

(87) PCT Pub. No.: WO03/045693

PCT Pub. Date: Jun. 5, 2003

(65) Prior Publication Data

US 2004/0259022 A1    Dec. 23, 2004

(30) Foreign Application Priority Data

Nov. 27, 2001   (DE) ................................ 101 57 769
Jan. 22, 2002   (DE) ................................ 102 02 441

(51) Int. Cl.
   *G03F 7/004*   (2006.01)

(52) U.S. Cl. .................... 430/306; 430/271.1; 430/942
(58) Field of Classification Search ................ 430/306, 430/271.1, 942
See application file for complete search history.

(56) References Cited

U.S. PATENT DOCUMENTS

| 5,147,757 | A | * | 9/1992 | Kurtz et al. ............. 430/270.1 |
| 5,259,311 | A | | 11/1993 | McCaughey, Jr. |
| 5,460,920 | A | * | 10/1995 | Telser et al. ................ 430/309 |
| 5,484,684 | A | | 1/1996 | Telser et al. |
| 6,511,784 | B1 | * | 1/2003 | Hiller et al. ............. 430/270.1 |
| 2001/0044076 | A1 | | 11/2001 | Hiller et al. |
| 2003/0136285 | A1 | | 7/2003 | Telser et al. |

FOREIGN PATENT DOCUMENTS

| EP | 565 818 | 10/1993 |
| EP | 1 136 254 | 9/2001 |
| WO | 93/23252 | 11/1993 |
| WO | 93/23253 | 11/1993 |
| WO | 02/49842 | 6/2002 |

OTHER PUBLICATIONS

Technik des Flexodrucks, p. 173ff., 4th Ed., 1999, Coating Verlag, St. Gallen, Switzerland.

* cited by examiner

Primary Examiner—John S. Chu
(74) Attorney, Agent, or Firm—Novak Druce & Quigg, LLP

(57) ABSTRACT

Laser-engravable flexographic printing elements for the production of flexographic printing plates have relief layers comprising blends of hydrophilic polymers and hydrophobic elastomers. Said flexographic printing elements are used for the production of flexographic printing plates by means of laser engraving.

17 Claims, No Drawings

LASER-ENGRAVABLE FLEXO PRINTING ELEMENTS FOR THE PRODUCTION OF FLEXO PRINTING FORMS CONTAINING BLENDS OF HYDROPHILIC POLYMERS AND HYDROPHOBIC ELASTOMERS

The present invention relates to laser-engravable flexographic printing elements for the production of flexographic printing plates whose relief layers comprise blends of hydrophilic polymers and hydrophobic elastomers. The present invention furthermore relates to a process for the production of flexographic printing plates by means of laser engraving using said flexographic printing elements.

In the direct laser engraving technique for the production of flexographic printing plates, a relief suitable for printing is engraved directly into a relief layer suitable for this purpose. By the action of laser radiation, layer components or their degradation products are removed in the form of hot gases, vapors, fumes, droplets or small particles and non-printing indentations are thus produced. It is true that the engraving of rubber printing cylinders by means of lasers has been known since the late 60s of the last century. However, this technique has acquired broader commercial interest only in recent years with the advent of improved laser systems. The improvements in the laser systems include better focusability of the laser beam, higher power and computer-controlled beam guidance.

Direct laser engraving has several advantages over the conventional production of flexographic printing plates. A number of time-consuming process steps, such as the creation of a photographic negative or development and drying of the printing plate, can be dispensed with. Furthermore, the sidewall shape of the individual relief elements can be individually designed in the laser engraving technique. While the sidewalls of a relief dot diverge continuously from the surface to the relief base in the case of photopolymer plates, a sidewall which is perpendicular or virtually perpendicular in the upper region and which does not broaden until the lower region can also be engraved by means of laser engraving. Thus, there is no, or at any rate little, increase in tonal value even with increasing wear of the plate during the printing process. Further details on the laser engraving technique are given, for example, in Technik des Flexodrucks, page 173 et seq., 4th Edition, 1999, Coating Verlag, St. Gallen, Switzerland.

In principle, commercial photopolymerizable flexographic printing elements can be used for the production of flexographic printing plates by means of laser engraving. U.S. Pat. No. 5,259,311 discloses a process in which a flexographic printing element is photochemically crosslinked by uniform exposure to UV/A in a first step and the release layer is then removed, and a printing relief is engraved by means of a laser in a second step. A further cleaning step by means of a flexographic washout agent and subsequent drying are then carried out.

EP-A 640 043 and EP-A 640 044 disclose one-layer and multilayer elastomeric laser-engravable flexographic printing elements for the production of flexographic printing plates by means of laser engraving. The elements consist of reinforced elastomeric layers. For the production of the layer, elastomeric binders, in particular thermoplastic elastomers, for example SBS, SIS or SEBS block copolymers, are used. As a result of the reinforcement, the mechanical strength of the layer is increased to permit flexographic printing. Reinforcement is achieved either by introduction of suitable fillers, photochemical or thermochemical crosslinking or combinations thereof.

However, the prior art has a number of disadvantages.

Conventional flexographic printing elements have a strong tendency to form melt edges around the engraved elements during laser engraving. At the edge of the engraved elements, the layer melts but is no longer decomposed or no longer completely decomposed. Such melt edges lead to ill-defined printing and generally cannot be removed even by subsequent washing.

Undesired melting of the layer furthermore leads to unsatisfactory resolution. With the use of commercial flexographic printing elements, the lines engraved by the laser are in practice generally much broader than actually desired, so that, for example, two closely adjacent indentations in the relief layer (i.e. negative lines), which should actually remain separated from one another by a central web, combine to form a single indentation.

For solving this problem, EP-A 1 136 254 proposes using relief layers having polyoxyalkylene/polyethylene oxide graft copolymers as binders. Such relief printing elements actually have good sensitivity to laser radiation and can be engraved using lasers without resulting in melt edges which can no longer be removed. However, the disadvantage is that the relief printing plates obtained can be used only to a limited extent. Since the polyoxyalkylene/polyoxyethylene oxide graft copolymers are water-soluble, the relief layer swells much too greatly in water-based flexographic printing inks and undesired effects occur during printing, for example an unacceptable increase in tonal value. Such printing plates can be used substantially only with UV printing inks. There is therefore an urgent need to provide laser-engravable relief printing elements which are suitable for printing with water-based inks but can nevertheless be engraved by means of lasers without undesired melting of the layer.

With the use of commercial flexographic printing elements as proposed by U.S. Pat. No. 5,259,311, the degradation products which form in the course of the laser engraving frequently present problems. The nongaseous fractions of the decomposition products formed in the course of the laser engraving are as a rule extremely tacky and may be completely or partly deposited again on the surface of the printing relief and in unfavorable cases may even react again with the surface. This leads to unclean surfaces and hence also to poor printing behavior.

For solving this problem, U.S. Pat. No. 5,259,311 therefore proposes subsequently cleaning the surface of the relief printing plate after the laser engraving by means of a solvent. However, the tacky decomposition products have substantially the same solubility behavior as the relief layer. For relief layers comprising the widely used hydrophobic SBS or SIS block copolymers, an organic solvent therefore also has to be used for removing the decomposition products. Although the crosslinked relief layer is no longer soluble therein, it is very probably still swellable. After such a subsequent washing step, the layer must therefore be dried again in a further process step. The time advantage achieved by laser engraving in the process is thus eliminated. It would be extremely desirable to be able to remove any deposits in a simple manner by means of water without the plate swelling excessively thereby.

It is an object of the present invention to provide flexographic printing elements for the production of flexographic printing plates by means of direct laser engraving, which printing elements are also suitable for printing with water-based flexographic printing inks and with which the occurrence of melt edges is substantially reduced and any deposits of decomposition products can be removed by simple treatment with water.

We have found that this object is achieved, in a first embodiment of the present invention, by a laser-engravable flexographic printing element which at least comprises:
- a dimensionally stable substrate,
- a laser-engravable elastomeric, crosslinked relief layer, obtainable by uniform crosslinking of a crosslinkable relief layer which comprises at least two polymeric binders and components for crosslinking, wherein the at least two polymeric binders comprise a blend of at least one hydrophilic polymer and at least one hydrophobic elastomer and the weight ratio of hydrophilic polymer to hydrophobic elastomer from 1:99 to 30:70, hydrophilic polymers prepared by means of emulsion polymerization being excluded.

In a second embodiment of the present invention, a laser-engravable flexographic printing element was found which at least comprises:
- a dimensionally stable substrate,
- a laser-engravable elastomeric, crosslinked relief layer, obtainable by uniform crosslinking of a crosslinkable relief layer which comprises at least two polymeric binders and components for crosslinking, wherein the at least two polymeric binders comprise a blend of at least one hydrophilic emulsion copolymer and at least one hydrophobic elastomer and the weight ratio of hydrophilic emulsion copolymer to hydrophobic elastomer is from 1:99 to 75:25.

That the use of blends comprising small amounts of hydrophilic polymers substantially suppresses the occurrence of melt edges and substantially improves the resolution of the printing plate was surprising and was unexpected even for a person skilled in the art. Residues of decomposition products can be readily washed away with water or aqueous or water-containing cleaning agents. The flexographic printing plates obtained are very useful for printing with water-based inks.

Regarding the present invention, the following may be stated specifically:

The term laser-engravable is to be understood as meaning that the relief layer has the property of absorbing laser radiation, in particular the radiation of an IR laser, so that it is removed or at least detached in those parts where it is exposed to a laser beam of sufficient intensity. Preferably, the layer is vaporized or decomposed thermally or by oxidation without melting beforehand, so that its decomposition products are removed from the layer in the form of hot gases, vapors, fumes or small particles.

Examples of suitable dimensionally stable substrates for flexographic printing elements are plates, sheets and conical and cylindrical sleeves of metals, such as steel, aluminum, copper or nickel, or of plastics, such as polyethylene terephthalate (PET), polyethylene naphthalate (PEN), polybutylene terephthalate, polyamide, polycarbonate, if required also woven fabrics and nonwovens, such as glass fiber fabrics, and composite materials, for example comprising glass fibers and plastics. Particularly suitable dimensionally stable substrates are dimensionally stable substrate sheets, for example polyester sheets, in particular PET or PEN sheets, or flexible metallic substrates, such as thin metal sheets or metal foils of steel, preferably of stainless steel, magnetizable spring steel, aluminum, zinc, magnesium, nickel, chromium or copper.

The novel, laser-engravable flexographic printing element furthermore comprises at least one laser-engravable, elastomeric and crosslinked relief layer. The crosslinked relief layer may be applied directly to the substrate. However, other layers, for example adhesion-promoting layers and/or resilient lower layers, may also be present between the substrate and the laser-engravable relief layer.

The crosslinked relief layer is obtainable by uniform crosslinking of a crosslinkable relief layer. The crosslinkable relief layer comprises at least two polymeric binders and components for crosslinking. Components for crosslinking may be polymerizable monomers or oligomers. However, they may also be crosslinkable groups which are linked to the binder in the chain, as side groups and/or as terminal groups or incorporated into the binder. Of course, the layer may contain both a binder having crosslinking groups and additional monomers. Components for crosslinking furthermore comprise compounds which can initiate crosslinking reactions, for example initiators. As a rule, the layer already has elastomeric properties before the crosslinking, but it is also possible for the relief layer to be nonelastomeric beforehand and to become elastomeric only as a result of crosslinking.

The at least two binders comprise a blend of at least one hydrophilic polymer and at least one hydrophobic elastomer. Hydrophilic is to be understood as meaning that the relevant polymer is preferably soluble or at least dispersible in water and/or in weak aqueous bases having a pH of from 7 to 11. The blend is as a rule a heterogeneous blend, i.e. the hydrophobic and the hydrophilic phase are distinguishable on the microscopic scale (for definition, cf. for example Saechtling, Kunststofftaschenbuch, 26th Edition, Hanser Verlag, Munich, Vienna, 1995, pages 51/52).

In the first embodiment of the invention, in principle any hydrophilic polymers can be used, hydrophilic polymers prepared by means of emulsion polymerization being excluded.

The hydrophilic polymers may be homopolymers or copolymers or graft copolymers. The polymers have hydrophilic groups. Depending on the chemical nature of the hydrophilic group, the groups may be linked either as side groups or as terminal groups to the polymer chain or may be part of the polymer chain itself. The chemical nature of the polymer chain is not an essential aspect of the invention. For example, polyalkylene or polyoxyalkylene chains may be used. Further examples include polymer chains linked by means of urethane, amido or ester groups. Straight or branched polyalkylene or polyoxyalkylene chains are preferably used. As a rule, the hydrophilic polymers are not or substantially not crosslinked in the first embodiment of the invention.

Examples of suitable hydrophilic groups include acid groups, such as —COOH, —$SO_3H$, —$PO(OH)_2$ or —$OPO(OH)_2$. Acid groups may also be present as salts, provided that the processibility to a blend having the hydrophobic phase is not impaired. If salts are to be used, it is therefore advisable to use salts having organic cations, for example tetraalkylammonium ions. The acid groups may also be present in the form of derivatives, for example as carboxamides —$CONH_2$. Further examples of suitable hydrophilic groups include —OH, ether groups —O— or polyether groups —O—(X—O)$_n$H, where X is as a rule an ethylene, propylene or butylene group and n is an integer from 1 to 200. Groups comprising nitrogen atoms, for example —$NH_2$, —NHR or $NR_2$, where R is an aliphatic or aromatic radical, or N- and/or O-heterocyclic groups, for example imidazolyl, oxazolyl or imadazolinyl groups, are furthermore suitable.

Of course, not all monomeric units of which the hydrophilic polymer is composed need have hydrophilic groups. It is sufficient if the polymer has hydrophilic groups in a number such that the polymer as a whole has the desired hydrophilic properties. It is self-evident to a person skilled in the art that, in the case of particularly strongly hydrophilic groups, for example —OH, fewer groups in the polymer are sufficient for achieving the desired hydrophilic properties of the polymer, whereas a larger number is required in the case of groups whose hydrophilic properties are less pronounced.

Monomers which have hydrophilic groups and an ethylenically unsaturated group are preferably used for the preparation of the hydrophilic polymers. The polymerization of the monomers is preferably effected by free radical polymerization. Optionally, further monomers which have one or more ethylenically unsaturated groups may be used as comonomers.

Hydrophilic polymers which comprise polyoxyalkylene, in particular polyoxyethylene, groups, chains or segments are furthermore preferred. Such polymers can be obtained, for example, by cationic polymerization from alkene oxides.

Examples of monomers having both hydrophilic groups and ethylenically unsaturated groups include carboxylic acids, for example acrylic acid or methacrylic acid.

Mono(meth)acrylates of the formula $H_2C=CR_1COO[(-CH_2)_m-O-]_nR_2$, where m is from 2 to 4, n is preferably from 1 to 30, $R_1$ is H or methyl and $R_2$ is H, methyl, ethyl, propyl or butyl, are furthermore suitable. The alkylene group $(-CH_2-)_m$ may be straight-chain or branched. It may be identical or different in all oxyalkylene units. 2-Hydroxyethyl (meth)acrylate and di-, tri- and tetraethylene glycol mono(meth)acrylate are particularly preferred.

Nitrogen-containing compounds, such as acrylamide or methacrylamide, and derivatives thereof, in particular their N-methylol derivatives with difunctional or polyfunctional alcohols and oligomeric or polymeric polyethylene oxide derivatives, are also suitable. Nitrogen-containing esters or amides of acrylic acid or methacrylic acid are also suitable, for example 2-dimethylaminoethyl (meth)acrylate, 2-dimethylaminoethyl (meth)acrylamide and any salts obtainable therefrom by protonation or quaternization. Further examples of nitrogen-containing compounds include vinylamine, N-vinylpyrrolidone, N-vinylformamide, N- and C-vinylimidazole, -oxazole, -imidazoline or -oxazoline.

Vinyl esters of aliphatic carboxylic acids, in particular vinyl acetate or vinyl propionate, can be particularly advantageously used. After polymerization, hydroxyl groups or vinyl alcohol units can be produced therefrom by hydrolysis.

Also suitable are derivatives of inorganic acids, for example phosphoric acid derivatives having ethylenically unsaturated groups, in particular phosphoric acid esters having ethylenically unsaturated groups, but not all acid groups may be esterified. Examples include phosphoric acid esters of the formula $H_2C=CR_1COO(CH_2-CHR_2-O-)_n-PO(OH)_2$, where $R_1$ is H or methyl, $R_2$ is H, methyl, ethyl, propyl or butyl and n is from 1 to 30. Preferred compounds include 2-(meth)acryloyloxyethyl phosphate, 2-(meth)acryloyloxypropyl phosphate, diethylene glycol (meth)acrylate phosphate, triethylene glycol (meth)acrylate phosphate or polyethylene glycol (meth)acrylate phosphate. Derivatives of phosphonic acids may also be used, for example vinylphosphonic acid.

Derivatives of S-containing acids, for example vinylsulfonic acid, 2-sulfoxyethyl methacrylate and isopropenesulfonic acid, are also suitable as hydrophilic monomers.

Mixtures of different monomers may also be used, provided that the monomers are copolymerizable and no incompatibilities occur between the various monomers.

Copolymers which also comprise monomer building blocks without hydrophilic groups in addition to the monomers having hydrophilic groups can optionally also be used. Examples of particularly suitable comonomers include acrylates or methacrylates, such as methyl (meth)acrylate, ethyl (meth)acrylate, n-butyl (meth)acrylate, tert-butyl (meth)acrylate, 2-ethylhexyl (meth)acrylate, n-octyl (meth)acrylate or dodecyl (meth)acrylate, acrylonitrile or aromatic vinyl compounds, such as styrene, vinyltoluene or α-methylstyrene.

Conjugated dienes, for example 1,3-butadiene or isoprene, may also be used as comonomers. Mixtures of a plurality of comonomers can of course also be used.

If slight crosslinking is desired, monomers having two or more ethylenically unsaturated groups may be used. Examples include hexanediol di(meth)acrylate, nonanediol di(meth)acrylate, divinylbenzene, ethylene glycol di(meth) acrylate and di-, tri- or tetraethylene glycol di(meth)acrylate or phosphoric acid derivatives of the formula $[H_2C=CR_1COO(CH_2-CHR_2-O-)_n-]_2PO(OH)$, where $R_1$ is H or methyl, $R_2$ is H, methyl, ethyl, propyl or butyl and n is from 1 to 30. The amount of such polyfunctional monomers should, however, not exceed 5, preferably 3, particularly preferably 1, mol %, based on the amount of all monomers used.

A person skilled in the art chooses the suitable polymerization technique for polymerizing monomers from the polymerization techniques available in principle. The monomers having ethylenic groups are preferably polymerized by means of free radical polymerization, emulsion polymerization being excluded in the case of the first embodiment of the invention. Advantageously, the polymerization is carried out by solution polymerization or mass polymerization.

The type and amount of the hydrophilic polymer in the relief layer are chosen by a person skilled in the art in accordance with the desired properties of the relief layer. If a person skilled in the art intends to use only a small amount of hydrophilic polymer, he will in general use a very strongly hydrophilic polymer. If, on the other hand, he intends to use a larger amount, a more weakly hydrophilic polymer can also be used. In addition, the surface properties of the printing plate, for example the ink acceptance behavior, can be particularly advantageously influenced by the type and amount of the hydrophilic polymer.

In the first embodiment of the invention, the weight ratio of hydrophilic polymer to hydrophobic elastomer in the relief layer is from 1:99 to 30:70, preferably from 2:98 to 20:80, particularly preferably from 3:97 to 15:85.

Furthermore, the type and amount of hydrophilic polymer in the relief layer should be such that the swellability of the crosslinked relief layer in water at pH 9 is not more than 5%, even if a higher swellability may be acceptable in individual cases for special applications. The swellability is preferably not more than 4%, particularly preferably not more than 3%. The swellability is determined by a swelling test in which the prepared, crosslinked flexographic printing plate is allowed to swell for 24 hours in an aqueous base (ammonia) at pH 9 and the weight increase is then determined.

The molecular weight of the hydrophilic polymer can be established by a person skilled in the art in accordance with the desired layer properties. In general, it is preferable to use hydrophilic polymers having a number average molecular weight $M_n$ of from 5 000 to 200 000, preferably from 10 000 to 100 000, g/mol, without it being intended to restrict the invention thereto.

Examples of hydrophilic polymers particularly suitable for carrying out the present invention are polymers comprising vinyl alcohol units, such as polyvinyl alcohol, partly hydrolyzed polyvinyl acetates or copolymers which also comprise other comonomers, for example ethylene or vinylpyrrolidone, in addition to vinyl alcohol units.

Very particularly preferred hydrophilic polymers are polyoxyalkylene/polyvinyl alcohol graft copolymers, in particular polyoxyethylene/polyvinyl alcohol graft copolymers. They can be prepared by polymerization of vinyl esters in the presence of polyalkylene oxides and a free radical polymerization initiator, followed by a second reaction stage in which at least some of the ester groups are hydrolyzed to vinyl alcohol structural units. In the course of this process, grafting of the vinyl ester units onto the polyalkylene oxides preferably occurs. However, mechanisms other than grafting are also conceivable. Polyoxyalkylene/polyvinyl alcohol graft copolymers are therefore to be understood as meaning both pure graft copolymers and blends of graft copolymers with residues of ungrafted polyalkylene oxides and at least partly hydrolyzed polyvinyl esters. Polyoxyalkylene/polyvinyl alcohol graft copolymers are known in principle. Their preparation and properties are disclosed in EP-A 1 136 154, paragraph [0018] to paragraph [0029]. These paragraphs should be considered to be part of this disclosure.

In the second embodiment of the invention, hydrophilic emulsion copolymers are used as the hydrophilic component of the blend. In this embodiment, it is also possible in principle to use larger amounts of the hydrophilic emulsion copolymer.

The weight ratio of hydrophilic emulsion copolymer to hydrophobic elastomer is from 1:99 to 75:25, preferably from 5:95 to 50:50, particularly preferably from 10:90 to 40:60.

Furthermore, the type and amount of the hydrophilic emulsion copolymer in the relief layer should also be such that the swellability of the crosslinked relief layer in water at pH 9 is preferably not more than 5%, even if a higher swellability may be acceptable in individual cases for special applications. The swellability is preferably not more than 4%, particularly preferably not more than 3%.

The preparation of polymers by means of emulsion polymerization is known in principle to a person skilled in the art. Here, monomers having ethylenically unsaturated or olefinic groups are subjected to free radical polymerization in emulsion, water-soluble initiators being used. For details of this polymerization technique, reference may be made to Ullmann's Encyclopedia of Industrial Chemistry 5th Edition, Vol. A21, pages 373 to 393, VCH Weinheim, 1992.

For the preparation of the hydrophilic emulsion copolymer, at least one hydrophilic monomer and at least one comonomer which is usually hydrophobic or substantially hydrophobic are used.

Suitable hydrophilic monomers for the second embodiment of the invention are in particular the hydrophilic monomers stated above in the case of the first embodiment of the invention and having ethylenically unsaturated groups. Preferred hydrophilic monomers include monoolefinic monomers having acid groups, in particular carboxyl groups, sulfo groups and phosphoric acid groups. It is also possible for some of the acid functions to be esterified. Examples include acrylic acid and methacrylic acid or vinylsulfonic acid. Also particularly suitable are modified carboxylic acids, for example acrylamide or methacrylamide. Phosphoric acid derivatives of the formula $H_2C=CR_1COO(CH_2\text{—}CHR_2\text{—}O\text{—})_n\text{—}PO(OH)_2$, where $R_1$ is H or methyl, $R_2$ is H, methyl, ethyl, propyl or butyl and n is from 1 to 30, are furthermore preferred. Preferred compounds include in particular 2-(meth)acryloyloxyethyl phosphate, 2-(meth)acryloyloxypropyl phosphate, diethylene glycol (meth)acrylate phosphate, triethylene glycol (meth)acrylate phosphate or polyethylene glycol (meth)acrylate phosphate. Mixtures of different acidic monomers can of course also be used, provided that no undesired effects are caused thereby.

Preferably used comonomers are elastomeric monomers. These are to be understood as meaning those monomers which form polymers having glass transition temperatures $T_g$ of less than 10° C. when polymerized in pure form. Examples of elastomeric monomers include in particular 1,3-dienes, such as butadiene, isoprene or neoprene, or acrylates, for example 2-ethylhexyl (meth)acrylate, n-butyl (meth)acrylate or ethyl (meth)acrylate. Butadiene and isoprene are particularly preferred.

Nonelastomeric monomers may also be used as comonomers. Examples include acrylates or methacrylates, such as methyl (meth)acrylate, or vinylaromatics, such as styrene, vinyltoluene or α-methylstyrene. Nonelastomeric comonomers can be used in special cases as the only comonomer in addition to the hydrophilic monomer, but it is preferable to use nonelastomeric comonomers only together with elastomeric comonomers. For example, styrene can be particularly advantageously used together with butadiene.

The hydrophilic emulsion copolymers may be crosslinked or uncrosslinked. They are preferably slightly crosslinked. Monomers having two or more ethylenically unsaturated groups may be used for the crosslinking. Examples include hexanediol di(meth)acrylate, nonanediol di(meth)acrylate, divinylbenzene, ethylene glycol di(meth)acrylate and di-, tri or tetraethylene glycol di(meth)acrylate or phosphoric acid derivatives of the formula $[H_2C=CR_1COO(CH_2\text{—}CHR_2\text{—}O\text{—})_n\text{—}]_2PO(OH)$, where $R_1$, $R_2$ and n have the above meanings. However, the degree of crosslinking should not be too high, in order to avoid adversely affecting the elastic properties of the relief printing plate. The amount of such polyfunctional monomers should therefore not exceed 10, preferably 5, particularly preferably 3, mol %, based on the amount of all monomers used.

The hydrophilic emulsion copolymers advantageously contain from 35 to 98% by weight of a conjugated diene and/or of an elastomeric acrylate, from 2 to 40% by weight of at least one monoolefinic hydrophilic monomer and from 0 to 60% by weight of other comonomers having olefinic groups, without it being intended to restrict the invention thereto.

The hydrophilic emulsion copolymers preferably contain from 40 to 95% by weight of a conjugated diene and/or of an elastomeric acrylate, from 5 to 40% by weight of at least one monoolefinic hydrophilic monomer and from 0 to 50% of other comonomers having olefinic groups.

Particularly advantageously, acrylic acid or methacrylic acid can be used as the monoolefinic hydrophilic monomer, as can acrylamide or methacrylamide.

Monoolefinic phosphoric acid derivatives can furthermore particularly advantageously be used as the monoolefinic hydrophilic monomer.

The monomer having hydrophilic groups can be incorporated uniformly, virtually uniformly, nonuniformly or in a block-like structure as polymerized units in the polymer.

However, there may also be emulsion copolymers having a core/shell structure in which the monomer having hydrophilic groups is completely or predominantly incorporated as polymerized units in the shell. Such structures can be obtained by starting the emulsion polymerization with one monomer, for example with a 1,3-diene, and adding a suitable hydrophilic monomer before the monomer is completely consumed. Further details and other preparation methods for core/shell structures are disclosed, for example, in EP-A 640 876 or EP-A 356 953.

Hydrophilic groups can also be anchored on the surface of an emulsion copolymer by subsequent grafting reactions. Such polymers can be prepared, for example, by means of the preparation method which is disclosed by EP-A 468 289 and in which an emulsion copolymer which contains (meth) acrylic acid as the hydrophilic monomer is first prepared. The emulsion copolymer is then reacted with glycidyl methacrylate, with the result that polyoxyethylene chains modified with methacrylate groups are formed on the surface of the emulsion polymer.

Both in the first and in the second embodiment of the invention, the second component of the blend is a hydrophobic elastomer. Those elastomers which are usually used for the preparation of conventional flexographic printing plates developable in organic media and which are neither soluble nor swellable in water are particularly suitable. Examples are natural rubber, polybutadiene, polyisoprene, styrene/butadiene rubber, nitrile/butadiene rubber, butyl rubber, styrene/isoprene rubber, polynorbornene rubber or ethylene/propylene/diene rubber (EPDM). Further examples include acrylate rubbers, such as those based on n-butyl acrylate or 2-ethylhexyl acrylate, ethylene/acrylate rubbers and ethylene/vinyl acetate rubbers.

The hydrophobic elastomer is preferably a hydrophobic, thermoplastic elastomeric block copolymer of alkenylaromatics and 1,3-dienes. The block copolymers may be both linear block copolymers and radial block copolymers. They are usually three-block copolymers of the A-B-A type, but may also be two-block polymers of the A-B type or those having a plurality of alternating elastomeric and thermoplastic blocks, e.g. A-B-A-B-A. Blends of two or more different block copolymers may also be used. Commercial three-block copolymers frequently contain certain amounts of two-block copolymers. The diene units may be 1,2- or 1,4-linked. Both block copolymers of the styrene/butadiene type and of the styrene/isoprene type may be used. They are commercially available, for example, under the name Kraton®. Thermoplastic elastomeric block copolymers having terminal blocks of styrene and a random styrene/butadiene middle block, which are available under the name Styroflex®, may furthermore be used. The block copolymers may also be completely or partly hydrogenated, for example in SEBS rubbers.

The amount of the blend in the relief layer is determined by a person skilled in the art in accordance with the desired properties of the layer and the desired crosslinking method. As a rule, the amount of the blend is from 40 to 95% by weight, based on the amount of all components of the laser-engravable relief layer. The amount of the blend is preferably from 50 to 80, very particularly preferably from 55 to 75, % by weight.

The type and amount of the components for crosslinking the layer depend on the desired crosslinking method and are chosen accordingly by a person skilled in the art. The uniform crosslinking of the crosslinkable relief layer is preferably carried out photochemically, thermochemically or by means of electron beams.

In the case of photochemical crosslinking, the relief layer comprises at least one photoinitiator or a photoinitiator system. Benzoin or benzoin derivatives, such as α-methylbenzoin or benzoin ether, benzil derivatives, e.g. benzil ketals, acylarylphosphine oxides, acrylarylphosphine esters or polynuclear quinones, are known to be suitable initiators for the photopolymerization, without it being intended to restrict the list thereto.

If the blend used has a sufficient amount of crosslinkable groups, the addition of additional crosslinkable monomers or oligomers is not necessary. As a rule, however, further polymerizable compounds or monomers are added for photochemical crosslinking. The monomers have at least one polymerizable, olefinically unsaturated group. Esters or amides of acrylic acid or methacrylic acid with mono- or polyfunctional alcohols, amines, aminoalcohols or hydroxyethers and hydroxyesters, styrene or substituted styrenes, esters of fumaric or maleic acid or allyl compounds have proven particularly advantageous. Examples of suitable monomers include butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide. Oligomers having olefinic groups may also be used. It is of course also possible to use mixtures of different monomers or oligomers, provided that no undesired properties occur. The total amount of any monomers used is established by a person skilled in the art in accordance with the desired properties of the relief layer. As a rule, however, 30% by weight, based on the amount of all components of the laser-engravable relief layer, should not be exceeded.

Thermal crosslinking can be carried out on the one hand analogously to the photochemical crosslinking by using a thermal polymerization initiator instead of a photoinitiator. In principle, commercial thermal initiators for free radical polymerization, for example suitable peroxides, hydroperoxides or azo compounds, can be used as photopolymerization initiators. The thermal crosslinking may furthermore be carried out by adding a heat-curable resin, for example an epoxy resin, as a crosslinking component to the layer.

Crosslinking by means of electron beams can be carried out on the one hand analogously to the photochemical crosslinking by using the photochemically crosslinkable relief layers described above and replacing the UV radiation by electron beams. The addition of initiators is not absolutely essential. By means of electron beams, polymers which have groups crosslinkable by means of electron beams can be crosslinked even directly, without the addition of further monomers. Such groups include in particular olefinic groups or protic groups, such as —OH, —NH$_2$, —NHR, —COOH or —SO$_3$H. Compounds having protic groups may additionally be used. Examples include di- or polyfunctional monomers are used in which terminal functional groups are linked to one another via a spacer, for example dialcohols, such as 1,4-butanediol, 1,6-hexanediol, 1,8-octanediol or 1,9-nonanediol, diamines, such as 1,6-hexanediamine, 1,8-hexanediamine, and dicarboxylic acids, such as 1,6-hexanedicarboxylic acid, terephthalic acid, maleic acid or fumaric acid.

The crosslinkable relief layer may furthermore optionally comprise an absorber for laser radiation. Mixtures of different absorbers for laser radiation may also be used. Suitable absorbers for laser radiation have a high absorption in the range of the laser wavelength. Particularly suitable absorbers are those which have a high absorption in the near infrared and in the longer-wave VIS range of the electromagnetic spectrum. Such absorbers are particularly suitable for absorbing radiation of Nd-YAG lasers (1 064 nm) and of IR diode lasers, which typically have wavelengths of from 700 to 900 nm and from 1 200 to 1 600 nm.

Examples of suitable absorbers for laser radiation in the infrared spectral range are strongly absorbing dyes, for example phthalocyanines, naphthalocyanines, cyanines, quinones, metal complex dyes, such as dithiolenes, or photochromic dyes. Other suitable absorbers are inorganic pigments, in particular intensely colored inorganic pigments, for example chromium oxides, iron oxides, carbon black or metallic particles. Particularly suitable absorbers for laser radiation are finely divided carbon black grades having a particle size of from 10 to 50 nm.

The amount of the optionally added absorber is chosen by a person skilled in the art in accordance with the respective desired properties of the laser-engravable flexographic printing element. In this context, a person skilled in the art will take into account the fact that the added absorbers influence not only the speed and efficiency of the engraving of the elastomeric layer by lasers but also other properties of the relief printing plate obtained as an end product of the process, for example its hardness, resilience, thermal conductivity or ink transfer behavior. As a rule, it is therefore advisable to use not more than 20, preferably not more than 10, % by weight of absorber for laser radiation.

As a rule, it is not advisable for absorbers for laser radiation which also absorb in the UV range to be added to relief layers which are to be photochemically crosslinked, since the photopolymerization is greatly impaired thereby.

A plasticizer may optionally also be added to the relief layer. A plurality of plasticizers may also be used. For example, it is possible to use two plasticizers, one being tailored in particular to the hydrophobic component of the blend and the other in particular to the hydrophilic component of the blend.

Examples of suitable plasticizers, particularly for the hydrophobic component of the blend, include paraffinic mineral oils, esters of dicarboxylic acids, such as dioctyl adipate or dioctyl terephthalate, naphthenic plasticizers or polybutadiene oils having a molecular weight from 500 to 5 000 g/mol.

Suitable plasticizers, particularly for the hydrophilic component of the blend, include high-boiling alcohols, such as glycerol, or polyoxyalkylenes, such as polyethylene glycols.

The amount of plasticizer in the relief layer is chosen by a person skilled in the art in accordance with the blend used and the desired hardness of the printing plate. As a rule, the amount of all plasticizers in the layer is from 0 to 30, preferably from 0 to 20, % by weight, based on the sum of all components of the layer.

The relief layer may furthermore comprise additives and assistants, for example dyes, dispersants, antistatic agents or abrasive particles. However, the amount of such additives should as a rule not exceed 5% by weight, based on the amount of all components of the crosslinkable, laser-engravable layer of the recording element.

The crosslinkable relief layer may also be composed of a plurality of part-layers. These crosslinkable part-layers may be of identical, roughly identical or different material composition. Such a multilayer structure, particularly a two-layer structure, is sometimes advantageous because surface properties and layer properties can thus be changed independently of one another in order to achieve an optimum printed copy. The laser-engravable flexographic printing element can have, for example, a thin laser-engravable upper layer whose composition was chosen with regard to optimum ink transfer, while the composition of the layer underneath was chosen with regard to optimum hardness or resilience.

Thorough mixing of the two components of the blend is necessary with regard to the quality of the laser-engravable relief layer. Suitable dispersants or compatibilizers may be added to support the uniform mixing of the two components of the blend.

The crosslinkable relief layer can in principle be produced by dissolving or dispersing all components in a suitable solvent and casting on a substrate. When solvents are used, the hydrophobic elastomer and the further components of the layer are preferably dissolved in an organic solvent suitable for this purpose and the hydrophilic polymer or hydrophilic emulsion copolymer is dispersed using a suitable dispersing unit. Examples of suitable dispersing units include ball mills, dissolvers, mechanical shakers, extruders or rolls. In the case of multilayer elements, a plurality of layers can be cast one on top of another in a manner known in principle. Alternatively, for example, the individual layers can be cast on temporary substrates and the layers then joined to one another by lamination.

However, the relief layer is preferably produced without using a solvent, and the two components of the blend and the further components of the layer are thoroughly mixed with one another in suitable mixing units, for example kneaders, extruders or roll mills, and then formed into a layer.

If an elastomeric binder which is not thermoplastic is used as the hydrophobic component of the blend, laminar mixing, for example by means of a roll mill, is advisable.

If thermoplastic elastomeric binders are used as the hydrophobic component of the blend, a homogeneous melt is preferably produced from the components of the layer, which melt can then be formed into a relief layer in a manner known in principle by means of extrusion and subsequent calendering.

A procedure in which the hydrophilic component of the blend is first thoroughly premixed with a part of the further components of the relief layer, such as monomers, assistants and, if required, a plasticizer, and processed to give a homogeneous hydrophilic composition has proven very particularly useful. Separately therefrom, the hydrophobic thermoplastic elastomer is processed with the remainder of the layer components and, if required, a plasticizer for the hydrophobic component at elevated temperatures in a suitable mixing unit to give a homogeneous melt. The melt is then combined with the prehomogenized hydrophilic composition and processed to give a homogeneous melt. High-quality blends are obtained in a short time by means of this procedure. A procedure in which all components of the relief layer are premixed with the hydrophilic component and the hydrophobic component is then introduced into this mixture has furthermore proven useful.

The uniform crosslinking of the crosslinkable relief layer can be carried out photochemically, in particular by exposure to UV-A radiation having a wavelength of from 320 to 400 nm, or UV-A/VIS radiation having a wavelength of from 320 to about 700 nm. Uniform thermochemical crosslinking is effected by very uniform heating of the relief layer at constant temperature. Furthermore, crosslinking can be effected by uniform irradiation using electron beams. The radiation dose required for crosslinking can particularly advantageously be divided into a plurality of part-doses.

Photochemical crosslinking is particularly suitable for relief layers which are transparent in the UV/VIS range and contain no strongly colored absorbers for laser radiation.

However, transparent relief layers can of course also be crosslinked thermochemically or by means of electron beams. Relief layers containing colored laser absorbers can advantageously be crosslinked thermochemically or by means of laser beams.

The thickness of the laser-engravable, elastomeric crosslinked relief layer or of all relief layers together is as a rule from 0.1 to 7 mm. The thickness is suitably chosen by a person skilled in the art in accordance with the desired use of the flexographic printing plate.

The thickness is preferably from 0.3 to 7 mm, more preferably from 0.5 to 5 mm and most preferably from 0.7 to 4 mm. The thickness is suitably chosen by a person skilled in the art in accordance with the desired use of the flexographic printing plate.

The novel, laser-engravable flexographic printing element may optionally comprise further layers in addition to the laser-engravable, elastomeric crosslinked relief layer.

Examples of such layers include an elastomeric lower layer which comprises another formulation, is present between the substrate and the laser-engravable layer or layers and need not necessarily be laser-engravable. By means of such lower layers, the mechanical properties of the relief printing plate can be modified without influencing the properties of the actual printing relief layer.

Resilient substructures which are present under the dimensionally stable substrate of the laser-engravable flexographic printing element, i.e. on the side opposite to the laser-engravable layer, serve the same purpose.

Further examples include adhesion-promoting layers which join the substrate to layers above it or which join different layers to one another.

Furthermore, the laser-engravable flexographic printing element can be protected from mechanical damage by a protective film which consists, for example, of PET, is present on the respective uppermost layer and has to be removed in each case before engraving with lasers. To facilitate removal, the protective film can also be siliconized or provided with a suitable nontacky release layer.

The novel, laser-engravable flexographic printing element comprising an elastomeric, crosslinked relief layer is used as a starting material for the production of a printing plate by means of laser engraving. For this purpose, a printing relief is engraved into the crosslinked relief layer by means of a laser. If a protective film is present, it is removed before the engraving.

IR lasers are particularly suitable for engraving. For example, a $CO_2$ laser having a wavelength of 10.6 μm can be used. Furthermore, Nd-YAG lasers (1 064 nm), IR diode lasers or solid-state lasers can be used. It is also possible to use lasers having shorter wavelengths, provided that the laser has sufficient intensity. For example, a frequency-doubled (532 nm) or frequency-tripled (355 nm) Nd-YAG laser or excimer lasers (e.g. 248 nm) may also be used.

The addition of absorbers for laser radiation depends substantially on the type of laser which is to be used for engraving. The binders used for the relief layer usually absorb the radiation of $CO_2$ lasers to a sufficient extent, so that additional IR absorbers in the relief layer are generally not required when this type of laser is used. The same applies to UV lasers, for example excimer lasers. In the case of Nd-YAG lasers and IR diode lasers, the addition of a laser absorber is generally necessary in order to be able to operate economically.

The image information to be engraved can be transferred directly from the layout computer system to the laser apparatus. The laser can be operated either continuously or pulsed.

Advantageously, relief elements in which the sidewalls of the elements are initially perpendicular and do not broaden until the lower region are engraved. A good shoulder shape in combination with little increase in tonal value is achieved thereby. However, sidewalls of other designs may also be engraved.

In the case of the novel flexographic printing elements, the amount of deposits formed on the flexographic printing plates in the course of the laser engraving is substantially reduced and in some cases even very small in comparison with flexographic printing plates whose relief layer does not contain the hydrophilic/hydrophobic blend. Such flexographic printing plates can even be used directly in certain circumstances.

Advantageously, the flexographic printing plate obtained is cleaned after the laser engraving. In some cases, this may be effected by simply blowing off or brushing off. However, it is preferable to use a liquid cleaning agent for the subsequent cleaning, in order also to be able to remove polymer fragments completely. This is particularly advisable, for example, when the flexographic printing plate is to be used for printing food packaging for which particularly stringent requirements with respect to volatile components are applicable.

The depth of the elements to be engraved depends on the total thickness of the relief and on the type of elements to be engraved and is determined by a person skilled in the art according to the properties desired for the printing plate. The depth of the relief elements to be engraved is at least 0.03 mm and preferably 0.05 mm; the reference here is to the minimum depth between individual dots. Printing plates having relief depths which are too small are generally unsuitable for printing by flexographic printing technology, since the negative elements fill up with printing ink to the point of flooding. Individual negative dots should customarily have greater depths; an advisable depth for negative dots 0.2 mm in diameter is customarily in the range from at least 0.07 to 0.08 mm. In the case of first surfaces which have been removed by engraving, a depth of more than 0.15 mm and preferably more than 0.4 mm is advisable. The latter is of course possible only in the case of an appropriately thick relief.

Solvent mixtures which usually serve as washout agents for conventionally produced flexographic printing plates may be used for subsequent cleaning. Examples include washout agents based on high-boiling, dearomatized mineral oil fractions, as disclosed, for example, by EP-A 332 070, or water-in-oil emulsions, as disclosed by EP-A 463 016.

The subsequent cleaning can very particularly advantageously be effected by means of water or an aqueous cleaning agent. Aqueous cleaning agents substantially comprise water and contain assistants, for example surfactants, for supporting the cleaning process. Mixtures which are usually used for developing conventional, water-developable flexographic printing plates can also be used.

Surprisingly, not only can certain amounts of the decomposition products be removed with water or aqueous cleaning agents but they can also be completely removed from the printing surfaces. This is true even where the blend used has only low contents of hydrophilic binders.

The subsequent cleaning can be effected, for example, by simple immersion or spraying of the relief printing plate or additionally supported by mechanical means, for example by brushing.

The flexographic printing plates obtained are particularly suitable for printing with water-based inks, but also suitable for printing with solvent-containing alcohol- or ester-based flexographic printing inks.

The examples that follow illustrate the invention.

The following substances were used for the examples.

| | |
|---|---|
| Kraton D-1102: | SBS block copolymer (Kraton Polymers) |
| JSR RB 810: | Syndiotactic 1,2-polybutadiene (JSR) |
| Alcotex 5-97: | Polyvinyl alcohol/polyethylene oxide graft copolymer (Harco) |
| Acronal S 695 P: | Styrene/butyl acrylate(meth)acrylamide emulsion copolymer (BASF) |
| Styrofan DS 3538: | Styrene/butadiene/acrylic acid emulsion copolymer (BASF) |
| Nisso PB B-1000 | Oligomeric polybutadiene oil (Nippon Soda) |
| Polyöl 130 | Oligomeric polybutadiene oil (Degussa-Hüls) |
| Glycerin | Glycerol (Aldrich) |
| Laromer HDDA: | 1,6-Hexanediol diacrylate (BASF) |
| Laromer LR 8830: | Phenylglycidyl ether acrylate (BASF) |
| Lucirin BDK | Benzil dimethyl ketal (BASF) |
| Kerobit TBK | 2,6-Di-tert-butyl p-cresol (Raschig) |

EXAMPLE 1

Preparation of a Hydrophilic, Monomer-containing Compound with PEO/PVA Graft Copolymers 2.25 kg (45.0% by weight) of solid Alcotex 5-97 are initially taken in a Diosna mixer (type V25 with shredder, from Dierks & Söhne GmbH) and are loosened for the duration of 3 minutes after the mixer has been switched on. After the addition of 0.5 kg (10.0% by weight) of glycerol, mixing is effected for a further 6 minutes. A material temperature of 50-55° C. is established. Finally, a solution of 2.165 kg (43.3% by weight) of Laromer LR 8830, 0.06 kg (1.2% by weight) of Lucirin BDK and 0.025 kg (0.5% by weight) of Kerobit TBK is added. After the mixing process has been continued for 6 minutes, the material temperature is increased to about 60° C. The mixer is stopped and the content is cooled to room temperature. 5 kg of a hydrophilic, flowable compound, which is referred to below as hydrophilic compound according to example 1, are obtained.

EXAMPLE 2

Flexographic Printing Element with PVA/PEO Graft Copolymer and 1,2-polybutadiene 22.5 g (50.0% by weight) of JSR RB 810 and 9.0 g (20.0% by weight) of Nisso PB B-1000 are kneaded in a laboratory measuring kneader (from Haake, 50 ml capacity) at an initial temperature of 150° C. until a homogeneous melt is obtained (about 6-8 minutes). A solution of 1.8 g (4.0% by weight) of Laromer HDDA, 0.225 g (0.5% by weight) of Lucirin BDK and 0.225 g (0.5% by weight) of Kerobit TBK is then added. After about 2 minutes, a homogeneous melt has once again formed. Finally, 11.25 g (25.0% by weight) of the hydrophilic compound according to example 1 are also added with continued kneading. After 5-6 minutes, a homogeneous melt has once again formed. A constant material temperature of 159° C. at a torque of 1.5 Nm results.

After cooling to room temperature, the kneaded material obtained is removed from the kneading chamber and divided into from about 3 to 5 g portions. The portions are arranged uniformly between two PET films. By pressing in a commercial rubber press at 160° C. and 200 bar, a 1.27 mm thick sheet is produced. A transparent, flexible and homogeneous flexographic printing element is obtained. The ratio of hydrophilic polymer to hydrophobic elastomer in the relief layer is 18:82.

EXAMPLE 3

Flexographic Printing Element with PVA/PEO Graft Copolymer and 1,2-polybutadiene, Best Mode The procedure was as in example 2, except that 27.0 g (60.0% by weight) of JSR RB 810, 9.0 g (20.0% by weight) of Nisso PB B-1000, 1.8 g (4.0% by weight) of Laromer HDDA, 0.225 g (0.5% by weight) of Lucirin BDK, 0.225 g (0.5% by weight) of Kerobit TBK and 6.75 g (15.0% by weight) of the hydrophilic compound according to example 1 were used.

A transparent, flexible and homogeneous flexographic printing element is obtained. The ratio of hydrophilic polymer to hydrophobic elastomer in the relief layer is 10:90.

EXAMPLE 4

Flexographic Printing Element with PVA/PEO Graft Copolymer and 1,2-polybutadiene The procedure was as in example 2, except that 29.25 g (65.0% by weight) of JSR RB 810, 9.0 g (20.0% by weight) of Nisso PB B-1000, 1.8 g (4.0% by weight) of Laromer HDDA, 0.225 g (0.5% by weight) of Lucirin BDK, 0.225 g (0.5% by weight) of Kerobit TBK and 4.5 g (10.0% by weight) of the hydrophilic compound according to example 1 were used.

A transparent, flexible and homogeneous flexographic printing element is obtained. The ratio of hydrophilic polymer to hydrophobic elastomer in the relief layer is 7:93.

EXAMPLE 5

Flexographic Printing Element with PVA/PEO Graft Copolymer and 1,2-polybutadiene The procedure was as in example 2, except that 31.5 g (70.0% by weight) of JSR RB 810, 9.0 g (20.0% by weight) of Nisso PB B-1000, 1.8 g (4.0% by weight) of Laromer HDDA, 0.225 g (0.5% by weight) of Lucirin BDK, 0.225 g (0.5% by weight) of Kerobit TBK and 2.25 g (5.0% by weight) of the hydrophilic compound according to example 1 were used.

A transparent, flexible and homogeneous flexographic printing element is obtained. The ratio of hydrophilic polymer to hydrophobic elastomer in the relief layer is 3:97.

EXAMPLE 6

Flexographic Printing Element with PVA/PEO Graft Copolymer and SBS Three-block Copolymer The procedure was as in example 2, except that 17.33 g (38.5% by weight) of Kraton D-1102, 7.2 g (16.0% by weight) of Nisso PB B-1000, 7.2 g (16.0% by weight) of Polyöl 130, 4.5 g (10.0% by weight) of Laromer HDDA, 0.9 g (2.0% by weight) of Lucirin BDK, 0.45 g (1.0% by weight) of Kerobit TBK and 7.43 g (16.5% by weight) of the hydrophilic compound according to example 1 were used. A constant material temperature of 160° C. at a torque of 0.2 Nm finally results.

A slightly opaque, flexible and homogeneous flexographic printing element is obtained. The ratio of hydrophilic polymer to hydrophobic elastomer in the relief layer is 16:84.

EXAMPLE 7

Flexographic Printing Element with Hydrophilic Emulsion Copolymer and SBS Three-block Copolymer First, a solution of 16.0 g of Nisso PB B-1000, 16.0 g of Polyöl 130, 10.0 g of Laromer HDDA, 2.0 g of Lucirin BDK and 1.0 g of Kerobit TBK is prepared at 80° C. in a 250 ml beaker. 16.5 g of Acronal S 695 P are added to the hot solution with manual stirring. After a few minutes, a pasty, homogeneous material forms, which is referred to below as Acronal dispersion compound.

17.33 g (38.5% by weight) of Kraton D-1102 and 27.67 g (61.5% by weight) of the Acronal dispersion compound are kneaded in a laboratory measuring kneader (from Haake, 50 ml capacity) at an initial temperature of 150° C. until a homogeneous melt is obtained (about 15 minutes). A constant material temperature of 160° C. at a torque of 0.3 Nm results.

The material obtained was processed as described in example 2 to give a flexographic printing element. A slightly opaque, flexible and homogeneous flexographic printing element is obtained. The ratio of hydrophilic emulsion copolymer to hydrophobic elastomer in the relief layer is 29:71.

EXAMPLE 8

Flexographic Printing Element with Hydrophilic Emulsion Copolymer and SBS Three-block Copolymer The procedure was as in example 7, except that Styrofan was used instead of Acronal.

A slightly opaque, flexible and homogeneous flexographic printing element is obtained. The ratio of hydrophilic emulsion copolymer to hydrophobic elastomer in the relief layer is 29:71.

COMPARATIVE EXAMPLE A

Flexographic Printing Element with 1,2-polybutadiene, No Hydrophilic Component 33.75 g (75.0% by weight) of JSR RB 810 and 9.0 g (20.0% by weight) of Nisso PB B-1000 are kneaded in a laboratory measuring kneader (from Haake, 50 ml capacity) at an initial temperature of 150° C. until a homogeneous melt is obtained (about 6-7 minutes). A solution of 1.8 g (4.0% by weight) of Laromer HDDA, 0.225 g (0.5% by weight) of Lucirin BDK and 0.225 g (0.5% by weight) of Kerobit TBK is then added with continued kneading. After about 3 minutes, a homogeneous melt has once again formed. A constant material temperature of 164° C. at a torque of 1.8 Nm results.

A transparent, flexible and homogeneous flexographic printing element is produced from the cooled and portioned kneaded material by pressing under the same conditions as in example 2.

COMPARATIVE EXAMPLE B

Flexographic Printing Element with SBS Rubber, No Hydrophilic Component 24.75 g (55.0% by weight) of Kraton D-1102 and 14.4 g (32.0% by weight) of Nisso PB B-1000 are kneaded in a laboratory measuring kneader (from Haake, 50 ml capacity) at an initial temperature of 140° C. until a homogeneous melt is obtained (about 7-8 minutes). A solution of 4.5 g (10.0% by weight) of Laromer HDDA, 0.9 g (2.0% by weight) of Lucirin BDK and 0.45 g (1.0% by weight) of Kerobit TBK is then added with continued stirring. After about 6 minutes, a homogeneous melt has once again formed. A constant material temperature of 160° C. at a torque of 1.4 Nm results.

A transparent, flexible and homogeneous flexographic printing element is produced from the cooled and portioned kneaded material by pressing under the same conditions as in example 2.

COMPARATIVE EXAMPLE C

Relief Printing Element with PVA/PEO Graft Copolymer, No Hydrophobic Component

A relief printing element according to example 1 of EP-A 1 136 254 was produced.

Photochemical Crosslinking of the Crosslinkable Flexographic Printing Elements

All flexographic printing elements are uniformly photochemically crosslinked.

The photochemical crosslinking is carried out by means of a nyloflex® F III exposure unit from BASF Drucksysteme GmbH, by first removing the transparent PET protective film of the flexographic printing element and then exposing the layer uniformly for the respective duration of crosslinking to UVA light without reduced pressure.

The mechanical hardness of the flexographic printing elements obtained is determined on the basis of DIN 53505 using a hardness measuring apparatus type U 72/80E, Heinrich Bareiss Prüfgerätebau GmbH, by removing the substrate sheet, forming a composite layer structure by stacking a plurality of layers one on top of the other to give a total layer thickness of about 6 mm and subjecting this composite layer structure to the hardness measurement.

The exposure times used, the visually assessed transparency of the resulting, crosslinked layers and the mechanical hardness data of the photochemically crosslinked, laser-engravable flexographic printing elements are shown in table 1 as an overview.

TABLE 1

| Example No. | Exposure time UVA [min] | Transparency (visually) | Mechanical hardness [° Shore A] |
|---|---|---|---|
| 2 | 10 | Transparent | 51 |
| 3 | 10 | Transparent | 60 |
| 4 | 10 | Transparent | 63 |
| 5 | 10 | Transparent | 65 |
| 6 | 10 | Slightly opaque | 38 |
| 7 | 10 | Slightly opaque | 37 |
| 8 | 10 | Slightly opaque | 42 |

TABLE 1-continued

| Example No. | Exposure time UVA [min] | Transparency (visually) | Mechanical hardness [° Shore A] |
|---|---|---|---|
| A | 10 | Transparent | 69 |
| B | 10 | Transparent | 50 |
| C | 10 | Transparent | 49 |

Laser Engraving of the Flexographic Printing Elements

A $CO_2$ laser (from ALE, type ALE meridian finesse) having a spot diameter of about 30 μm and a nominal power of 250 watt is used for laser engraving experiments. The power on the plate surface was about 150 watt at maximum power. The laser engraving experiments were carried out using the following software parameters: Total relief=75, first step=48, engraving speed=240 rpm and shoulder base width=1.24.

After the flexographic printing element has been clamped on a cylinder, a test motif consisting of various, representative, positive and negative elements is engraved into the flexographic printing element. In addition to uniform 0% tonal values and 100% tonal values, the motif also contains 40 μm wide negative lines in the axial and transverse direction relative to the axis of rotation of the cylinder.

After the laser engraving, the flexographic printing plates obtained are washed with water for two minutes with simultaneous brushing of the surface. A nyloprint® washer (apparatus combination CW 22×30, BASF Drucksysteme GmbH) is used for this purpose.

In order to assess the quality of the flexographic printing plates, the following features are determined:

The engraving depth D as a measure of the sensitivity, measured as the height difference between a region in which material has been completely removed and the plate surface.

The actual width $W_{tr}$ of the 40 μm wide transverse negative line and the difference $\Delta W_{tr}$ between the actual width and the required width of 40 μm as a measure of the accuracy.

The actual width $W_{ax}$ of the 40 μm wide axial negative line and the difference $\Delta W_{ax}$ between the actual width and the required width of 40 μm as a measure of the accuracy.

The visual assessment of the formation of deposits, melt edges and tacky droplets (deposits) and the visual assessment of the washability of superficial deposits (washability) in the subsequent washing with water.

The swelling $S_W$ of the laser-engraved flexographic printing element as a measure of the resistance to aqueous flexographic printing inks. The swellability is determined by a swelling test in which a piece of the crosslinked relief printing element is immersed for 24 hours at room temperature in an aqueous base (ammonia water) at pH 9. The percentage weight increase of the layer in the course of the test is determined.

TABLE 2 lists the determined results for all inventive and comparative examples.

| Example No. | Elastomer | Amount | Hydrophilic polymer | Amount | Gravure gap T [μm] | $B_{tr}$ [μm] | $\Delta B_{tr}$ [μm] | $B_{ax}$ [μm] | $\Delta B_{ax}$ [μm] | Deposits (visually) | Washability (visually) | Swelling $S_W$ [%] |
|---|---|---|---|---|---|---|---|---|---|---|---|---|
| 2 | syndiotactic 1.2 PB | 82 | PVA/PEO | 18 | 810 | 69 | +29 | 39 | −1 | little | very good | 3.6 |
| 3 | syndiotactic 1.2 PB | 90 | PVA/PEO | 10 | 760 | 77 | +37 | 41 | +1 | little | very good | 2.2 |
| 4 | syndiotactic 1.2 PB | 93 | PVA/PEO | 7 | 870 | 71 | +31 | 49 | +9 | medium | good | 1.6 |
| 5 | syndiotactic 1.2 PB | 97 | PVA/PEO | 3 | 720 | 84 | +44 | 55 | +15 | medium | good | 1.0 |
| 6 | SBS | 84 | PVA/PEO | 16 | 730 | 95 | +55 | 66 | +26 | medium | very good | 4.2 |
| 7 | SBS | 71 | Acronal | 29 | 690 | 98 | +58 | 78 | +38 | high | good | 0.8 |
| 8 | SBS | 71 | Sytrofan | 29 | 700 | 105 | +65 | 71 | +31 | high | good | 1.4 |
| A | syndiotactic 1.2 PB | 100 | — | — | 690 | 96 | +46 | 64 | +24 | medium | bad | 0.5 |
| B | SBS | 100 | — | — | 660 | 104 | +64 | 76 | +36 | high | bad | 0.4 |
| C | — | — | PVA/PEO | 100 | 600 | 124 | +84 | 68 | +28 | medium | very good | 82 |

The amount of hydrophilic polymer is in each case based on the total amount of polymer.

The inventive laser-engravable flexographic printing elements comprising hydrophilic/hydrophobic blends are distinctly superior to laser-engravable flexographic printing elements which do not include a blend as a binder.

Fine relief elements such as the negative lines shown prove to be imagable in high quality in all cases. Melt edges, laser waste and deposited particles are completely removable by short treatment with water.

The flexographic printing plates do not swell excessively when subjected to a swelling test in an aqueous base.

We claim:

1. A laser-engravable flexographic printing element for the production of flexographic printing plates, at least comprising
a dimensionally stable substrate,
a laser-engravable elastomeric, crosslinked relief layer, obtainable by uniform crosslinking of a crosslinkable relief layer which comprises at least two polymeric binders and components for crosslinking,
wherein the at least two polymeric binders comprise a blend of at least one hydrophilic polymer and at least one hydrophobic elastomer, said at least one hydrophilic polymer comprising a polymer comprising a vinyl alcohol unit, and the weight ratio of hydrophilic polymer to hydrophobic elastomer is from 1:99 to 30:70, hydrophilic polymers prepared by means of emulsion polymerization being excluded.

2. A laser-engravable flexographic printing element as claimed in claim 1, wherein the weight ratio of hydrophilic polymer to hydrophobic elastomer is from 2:98 to 20:80.

3. A laser-engravable flexographic printing element as claimed in claim 1, wherein the hydrophilic polymer is a polyoxyalkylene/polyvinyl alcohol graft copolymer.

4. A laser-engravable flexographic printing element for the production of flexographic printing plates, at least comprising
- a dimensionally stable substrate,
- a laser-engravable elastomeric, crosslinked relief layer, obtainable by uniform crosslinking of a crosslinkable relief layer which comprises at least two polymeric binders and components for crosslinking,
- wherein the at least two polymeric binders comprise a blend of at least one hydrophilic emulsion copolymer having a core/shell structure and containing from 35 to 98% by weight of at least one of a conjugated diene and an elastomeric acrylate, from 2 to 40% by weight of at least one monoolefinic hydrophilic monomer and from 0 to 60% by weight of other monomers having olefinic groups, and
- at least one hydrophobic elastomer and the weight ratio of hydrophilic emulsion copolymer to hydrophobic elastomer is from 1:99 to 75:25.

5. A laser-engravable flexographic printing element as claimed in claim 4, wherein the weight ratio of hydrophilic emulsion copolymer to hydrophobic elastomer is from 5:95 to 50:50.

6. A laser-engravable flexographic printing element as claimed in claim 4, wherein the hydrophilic emulsion copolymer is a copolymer of at least one hydrophilic monomer and at least one elastomeric monomer.

7. A laser-engravable flexographic printing element as claimed in claim 6, wherein the emulsion copolymer comprises from 35 to 98% by weight of at least one conjugated diene and/or of one elastomeric acrylate, from 2 to 40% by weight of at least one monoolefinic hydrophilic monomer and from 0 to 60% by weight of other comonomers having olefinic groups.

8. A laser-engravable flexographic printing element as claimed in claim 7, wherein the hydrophilic monomer is acrylic acid or methacrylic acid.

9. A laser-engravable flexographic printing element as claimed in claim 7, wherein the hydrophilic monomer is acrylamide or methacrylamide.

10. A laser-engravable flexographic printing element as claimed in claim 7, wherein the hydrophilic monomer is a monoolefinic phosphoric acid derivative.

11. A laser-engravable flexographic printing element as claimed in claim 1, wherein the hydrophobic elastomer is a thermoplastic elastomeric block copolymer.

12. A laser-engravable flexographic printing element as claimed in claim 1, wherein the relief layer furthermore comprises at least one absorber for laser radiation.

13. A laser-engravable flexographic printing element as claimed in claim 1, wherein the uniform crosslinking of the relief layer is carried out photochemically, thermochemically or by means of electron beams.

14. A process for the production of flexographic printing plates, in which a printing relief is engraved in the crosslinked relief layer of a flexographic printing element as claimed in claim 1 by means of a laser.

15. A process as claimed in claim 14, wherein the surface of the flexographic printing plate is cleaned after the laser engraving.

16. A process as claimed in claim 15, wherein the subsequent cleaning is effected by means of water or an aqueous cleaning agent.

17. A laser-engravable flexographic printing element as claimed in claim 4, wherein said core/shell structure contains from 35% to 98% by weight of a conjugated diene and elastomeric acrylate.

\* \* \* \* \*